United States Patent [19]
Aoki

[11] Patent Number: 5,352,902
[45] Date of Patent: Oct. 4, 1994

[54] METHOD FOR CONTROLLING PLASMA SURFACE-TREATMENTS WITH A PLURALITY OF PHOTODETECTORS AND OPTICAL FILTERS

[75] Inventor: Kazutsugu Aoki, Kanagawa, Japan

[73] Assignees: Tokyo Electron Kabushiki Kaisha, Tokyo; Tokyo Electron Tohoku Kabushiki Kaisha, Esashi, both of Japan

[21] Appl. No.: 84,984

[22] Filed: Jul. 2, 1993

[30] Foreign Application Priority Data

Jul. 6, 1992 [JP] Japan .................................. 3-200125

[51] Int. Cl.$^5$ ............................................. G01N 15/06
[52] U.S. Cl. .................................. 250/575; 250/492.2
[58] Field of Search ..................... 250/561, 575, 492.1, 250/573, 492.2, 492.3, 459.1; 204/164, 298.32; 427/8, 488

[56] References Cited

U.S. PATENT DOCUMENTS

| 4,902,934 | 2/1990 | Miyamura et al. | 250/492.2 |
| 4,945,774 | 8/1990 | Beard et al. | 250/492.2 |

FOREIGN PATENT DOCUMENTS

| 56-115536 | 9/1981 | Japan . |
| 56-165327 | 12/1981 | Japan . |
| 5-47717 | 2/1993 | Japan . |

OTHER PUBLICATIONS

An English language abstract of Japanese Laid Open Patent Publication No. 5-47717 to Watanabe, listed above.

*Primary Examiner*—David C. Nelms
*Assistant Examiner*—Que T. Le
*Attorney, Agent, or Firm*—Beveridge, DeGrandi, Weilacher & Young

[57] ABSTRACT

In conducting a plurality of kinds of surface-treatments on objects to be treated, concentration of produced gases in exhaust gas discharged from a reaction vessel are detected, and data of the detected concentrations are compared with reference data stored in a control unit to continuously control and process the respective surface-treatments. As a result, processing control can be performed suitably for the respective kinds of surface-treatments, and different kinds of surface-treatments can be continuously conducted by one and the same surface-treatment device.

15 Claims, 8 Drawing Sheets

METHOD FOR CONTROLLING PLASMA SURFACE-TREATMENTS WITH A PLURALITY OF PHOTODETECTORS AND OPTICAL FILTERS

BACKGROUND OF THE INVENTION

This invention relates to a method for controlling plasma surface-treatments, specifically a method for controlling plasma surface-treatments which can perform a plurality of kinds of surface treatments on an object to be treated in continuous steps.

Some LSI fabrication processes include surface treatments of thin films with plasma. For example, the ashing of organic thin films is widely used in resist removing steps, and etching with plasma is an essential technique to the etching of micronized patterns of integrated circuits in objects to be treated.

The ashing speed and the etching speed vary depending on various factors, such as resist materials, etched materials, specimen temperatures, processing conditions and other conditions. The ashing requires no precise time control but essentially requires endpoint detection of an ashing because excessive exposure of specimens to plasma causes radiation damages, contamination, etc. The etching requires endpoint detection of an etching because unnecessary parts of oxide films are removed to expose underlying doped layers.

Conventionally an endpoint of an ashing is detected by the method in which an intensity of interference waves of reflected light against a photoresist, and reflected light against the surface of the substrate is measured based on that the intensity of the interference waves correspond to a film thickness of a resist. In addition, for example, as described in Japanese Patent Laid-Open Publication No. 115536/1981, since an emission spectrum abruptly changes at the endpoint of an etching, the change is detected. Fluorescence is detected. Plasma is directly visually observed. Japanese Patent Laid-Open Publication No. 165327/1981 describes a method of detecting a gas pressure in a reaction vessel. On the other hand, in such surface treatments states of surfaces being treated have to be monitored. To this end, surfaces which have been actually treated are checked based on their states, or surfaces being treated are monitored through the above-mentioned optical methods or the visual observation of plasma.

These conventional methods for optically monitoring plasma disadvantageously require spectroscopes and optical instruments, and devices for conducting these methods are accordingly complicated and expensive. In addition, these devices need complicated operations.

Especially in such optical endpoint detection of such surface treatment, monochromators are used. But detected wavelengths vary depending on kinds of films to be surface-treated, e.g., Poly-Si, SiN, etc., and different monochromators have to be needed for respective wavelengths. When a large number of objects are surface-treated, the endpoint detection of the surface treatments are more difficult.

Disadvantageously the visual observation needs some experience, and the human sense is not reliable. In addition, during the visual observation, an operator has to confine himself on the work, which lowers productivities. The method in which states of actually surface-treated objects are checked wastes might waste the objects. The method in which a gas pressure in a reaction vessel is detected must have a vacuum gauge built in the reaction vessel, which makes the device complicated, and the vacuum gauge might be degraded by exposure to plasma.

SUMMARY OF THE INVENTION

In view of these disadvantages this invention has been made. An object of this invention is to provide a method for controlling plasma surface-treatments which can be carried out in a simply structured and simply operated device, and especially enables a plurality of kinds of surfaces to be continuously treated in one and the same surface-treatment device.

This invention relates to a method for controlling a plurality of kinds of plasma surface-treatments in which a plurality of kinds of surface-treatments are continuously conducted on objects to be treated in a reaction vessel with plasma discharges, and is characterized in that in conducting a first one of the surface-treatments, a concentration of a produced gas generated in the first surface-treatment, which is contained in exhaust gas discharged from the reaction vessel is optically detected, and data of the detected concentration of the produced gas is compared with preset reference data of the first surface-treatment to control the first surface-treatment, whereby the first surface-treatment is controlled. In a second one of the surface-treatments following the first surface-treatment, a concentration of a produced gas generated in the second surface-treatment, which is contained in exhaust discharged from the reaction vessel is detected, and data of the detected concentration of the produced gas with preset reference data of the second surface-treatment is compared, whereby the second surface-treatment is controlled.

DETAILED DESCRIPTION OF THE PREFERRED EMBODIMENTS

Figure 1A:
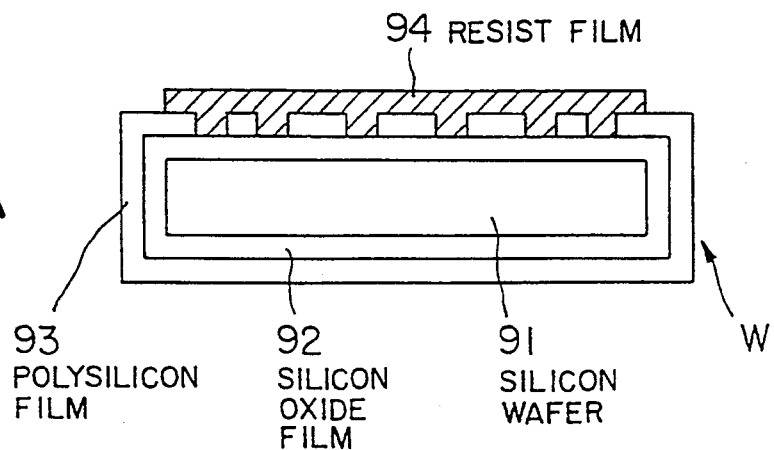
FIG. 1A to 1C are views of steps exemplifying plasma processing of semiconductor wafers.
Figure 1B:
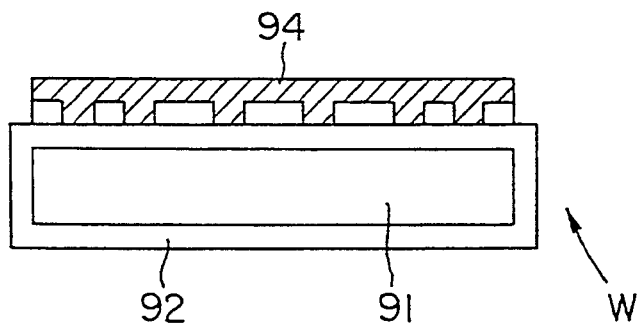
Figure 1C:
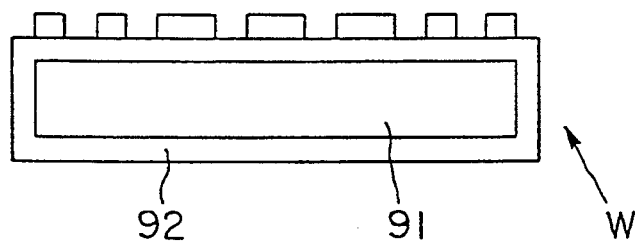

The steps of plasma treatment of an object to be treated will be explained with reference to FIGS. 1A to 1F. FIG. 1A is a schematic view of a semiconductor wafer W as an object to be treated with plasma. A silicon oxide film 92 of, e.g., a 1000 Å-film thickness, and a polysilicon film 93 of, e.g., a 4000 Å-film thickness are formed in the stated order on the upper and the lower surfaces of a silicon wafer 91 (on all the surface of the wafer including the side surfaces). A pattern is formed in that of the polysilicon film 93 on the upper surface which is to be treated. That of the polysilicon film on the upper surface is covered with a novolak-based resist film 94 of, e.g., a 13000–18000 Å thickness.

Figure 5:
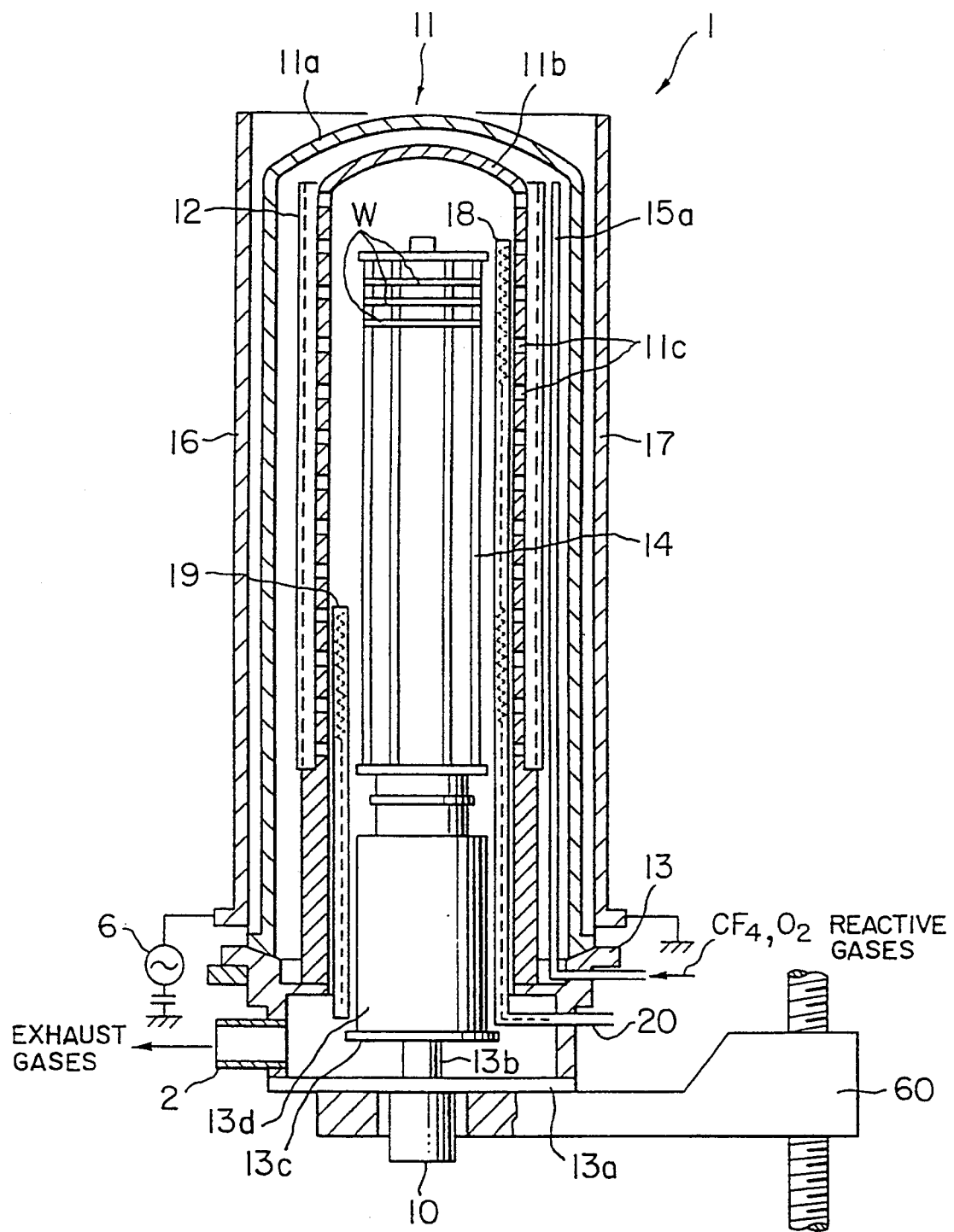
FIG. 5 is a detailed view of the surface-treatment device of FIG. 4.

Then, as in FIG. 5, 66 sheets of the thus-prepared semiconductor wafers W are mounted on a wafer boat 14 and loaded into a reaction tube 11 by a conveyor mechanism 60. Subsequently the interior of the reaction tube 11 is evacuated up to, e.g., $1 \times 10^{-3}$ Torr. Then with the wafer boat 14 set on rotation for securing uniform surface treatment, a mixed gas of, e.g., fleon ($CF_4$) gas and oxygen ($O_2$) is fed into an injector 20 at a flow rate ratio of $DF_4/O_2$—about 11/3 and injected through an injection port of the injector 20. Concurrently the interior of the reaction tube 11 is exhausted to have a 0.2 Torr pressure. A high-frequency voltage of, e.g., a 2 Kw-electric power and a 13.56 MHz-frequency is applied between electrodes 16, 17 at the room temperature, and plasma of the mixed gas is generated.

Then, the fluorine radicals and the oxygen radicals in the plasma pass through a plasma tunnel 12 consisting of an aluminium cover having a good conductivity into an inner cylinder 11b and etch for, e.g., about 20 minutes that of the polysilicon film 93 on the lower surface (including the side surfaces), i.e., that of the polysilicon film 93 which is not covered with the reist film 94. And the polysilicon film 93 is removed as in FIG. 1B. The etching time is suitably controllable based on endpoint detection by endpoint monitoring.

The etching of the lower surface of the semiconductor wafer W is followed by the ashing step of that of the resist film 94 on the upper surface of the semiconductor wafer W. The ashing is conducted with a flow rate ratio of fleon gas and oxygen gas set at $CF_4/O_2 = 1/7 - 1/5$, and with the interior of the reaction tube 11 heated up to below, e.g., 200° C. by a rod heater. And the resist film 94 is removed as in FIG. 1C. An endpoint of the ashing can be known by observing NDIR (abbreviation for infrared absorption spectrum of the exhaust) very near, e.g., the exhaust port of the pump.

Next, the method for controlling a plasma surface-treatments according to this invention will be explained with reference to FIG. 2.

Figure 2:
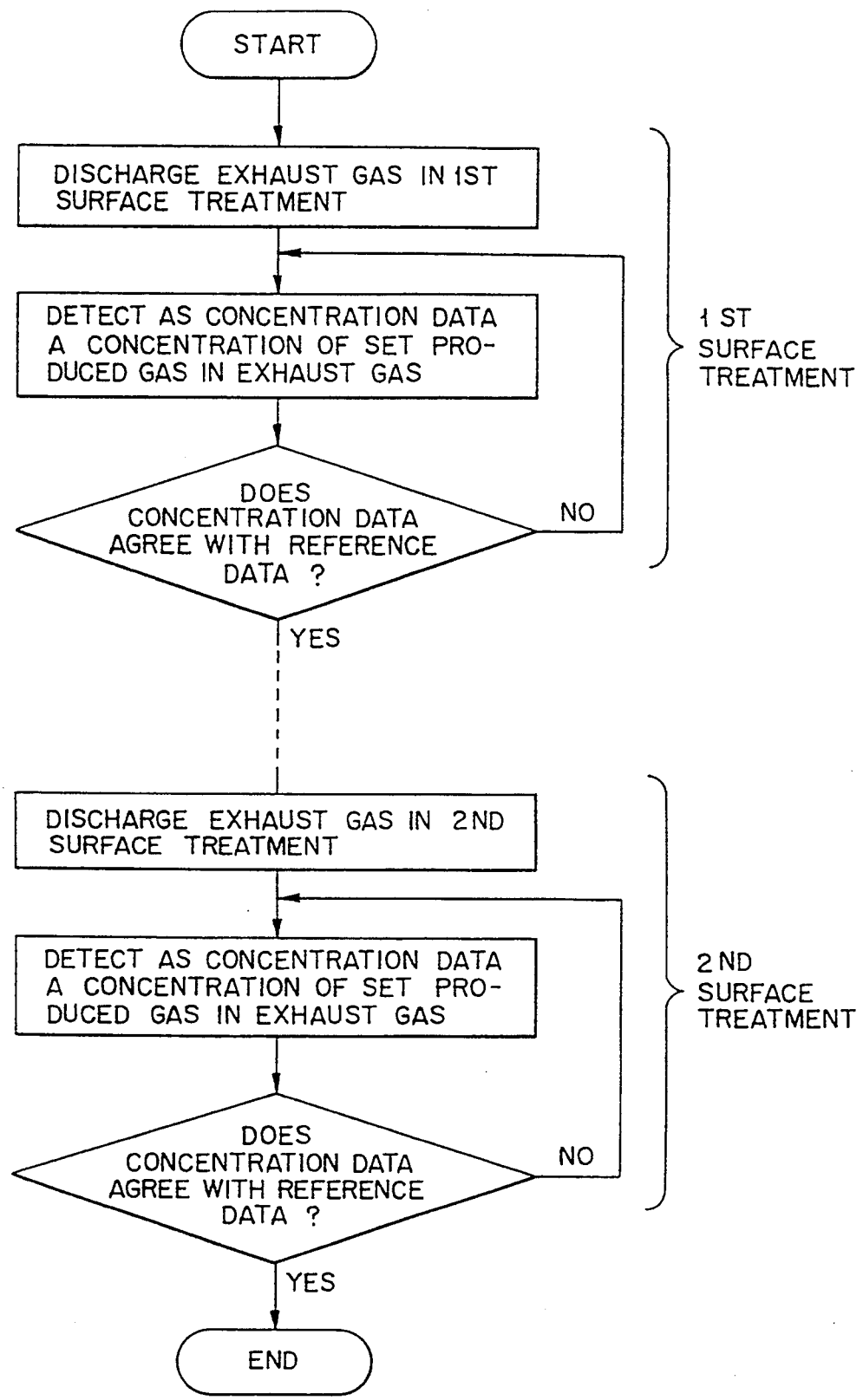
FIG. 2 is an explanatory view of the principle of the method for controlling plasma surface-treatments according to this invention.

In the method for controlling plasma surface-treatments of FIG. 2, in treating a plurality of kinds of surfaces of an object to be treated with plasma, when a first surface-treatment (e.g., etching) is conducted, firstly a concentration of a gas in the exhaust gas from the reaction vessel, which (gas) has been produced in the first surface-treatment is photodetected. Then, data of the detected concentration of the produced gas is compared with preset reference concentration data for the first surface-treatment so as to control the first surface-treatment. When both data do not agree with each other, this step is repeated until both data agree with each other. Then in conducting a second surface-treatment (e.g., ashing) continuously following the first surface-treatment, a concentration of a gas in the exhaust gas, which (gas) has been produced in the second surface-treatment is photodetected, and data of the detected concentration is compared with preset reference concentration data for the second surface-treatment to control the second surface-treatment. Thus, a plurality of kinds of surface-treatments are continuously conducted.

A device for controlling plasma surface-treatments to be used in this invention will be explained with reference to FIG. 3.

Figure 3:
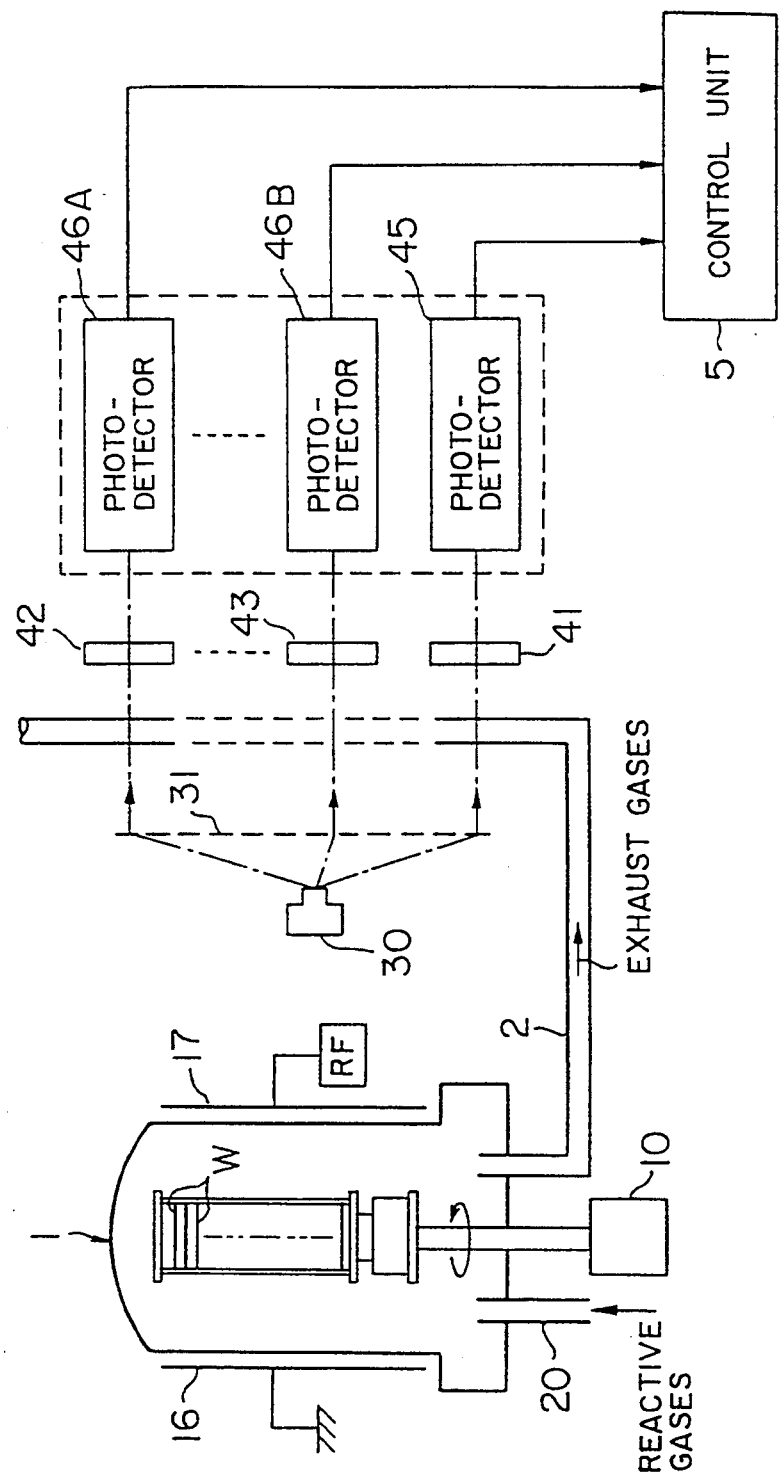
FIG. 3 is an explanatory view of the operational principle of a control device used in the method for controlling plasma surface-treatments according to this invention.

As in FIG. 3, in the device for controlling plasma surface-treatments used in this invention, objects to be treated W are accommodated in a reaction vessel 1, and the objects to be treated W are turned by a rotation mechanism 10. With the objects W set on rotation, reactive gases for each of a plurality of kinds of surface-treatments are fed into the reaction vessel 1 through an injector 20 to subject the objects continuously to surface-treatments with plasma generated by gas discharges of electrodes 16, 17 charged with a high-frequency power. The control device used in this invention comprises a light source 30 for applying light through a collimator lens 31 to exhaust gas from an exhaust pipe connected to a reaction vessel 1, a first detection filter 42 for passing only a component of the light from the light source 30 having a first wavelength range, which (component) can be absorbed by a produced gas in the exhaust gas in a first one of a plurality of kinds of surface-treatments, a second detection filter 43 for passing only a component of the light from the light source 30 having a second wavelength range, which (component) can be absorbed by a produced gas in exhaust gas in a second one of a plurality of kinds of surface-treatments, and a reference filter 41 for passing all wavelengths of the light from the light source 30. The device further comprises photodetectors 45, 46A, 46B associated respectively with the first detection filter 42, the second detection filter 43 and the reference filter 41 for converting into electric signals the light which has passed the associated filters, and outputting the same, and a control unit 5 for comparing detected data computed based on the outputted electric signals with reference data preset for the respective surface-treatments to control the respective surface-treatments. Based on the control by the control unit 5, a plurality of kinds of surface-treatments are continuously conducted on the objects to be treated.

According to the method for controlling plasma surface-treatments of this invention, in conducting a plurality of kinds of surface-treatments using the above described controlling device, concentrations of the produced gases in the exhaust gases of respective surface-treatments are photodetected, and data of the detected concentrations are compared with reference data to control the respective surface-treatments for the surface-treatments of objects to be treated. Accordingly treatment control can be made suitably for different kinds of surface-treatments, and the different kinds of surface-treatments can be continuously conducted in one and the same surface-treatment device.

An embodiment of the method for controlling plasma surface-treatments according to this invention will be explained with reference to FIGS. 4 to 7. The surface-treatment device to be controlled by the controlling method according to this embodiment can conduct singly both etching and ashing.

Figure 4:
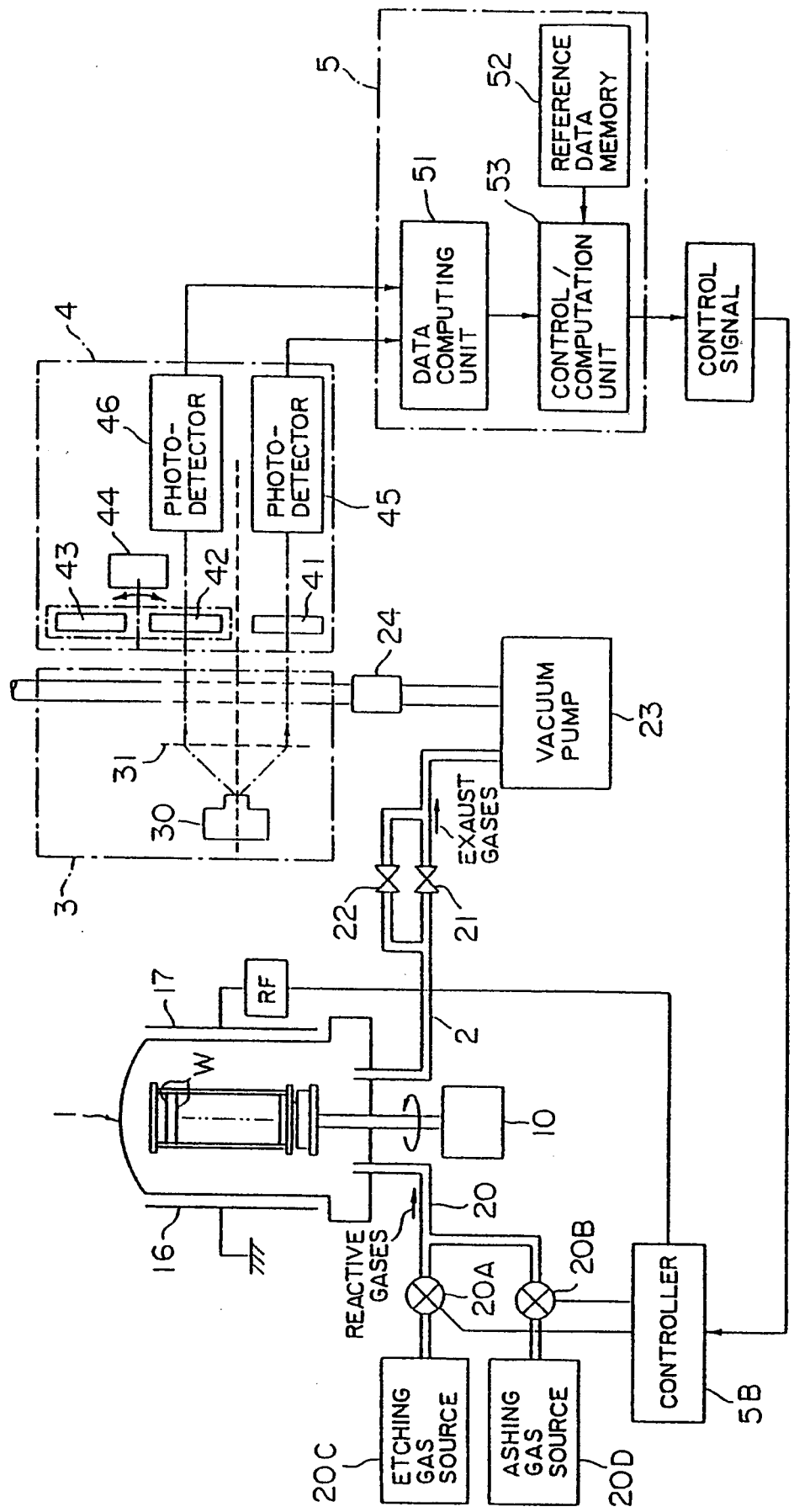
FIG. 4 is a general block diagram of one example of the control device used in this invention.
Figure 6:
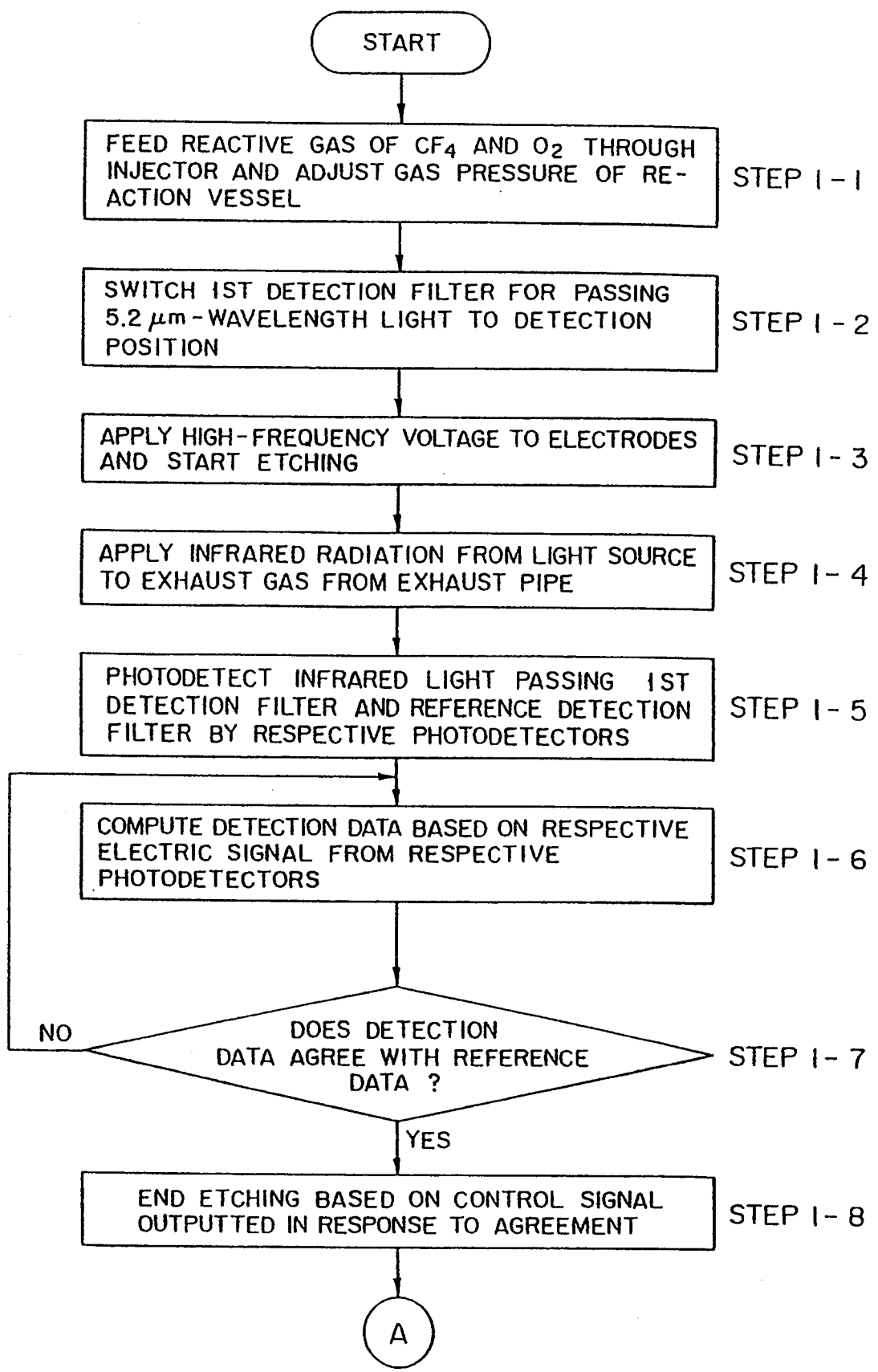
FIG. 6 is an operational flow chart of the method for controlling plasma surface-treatments according to one embodiment of this invention.
Figure 7:
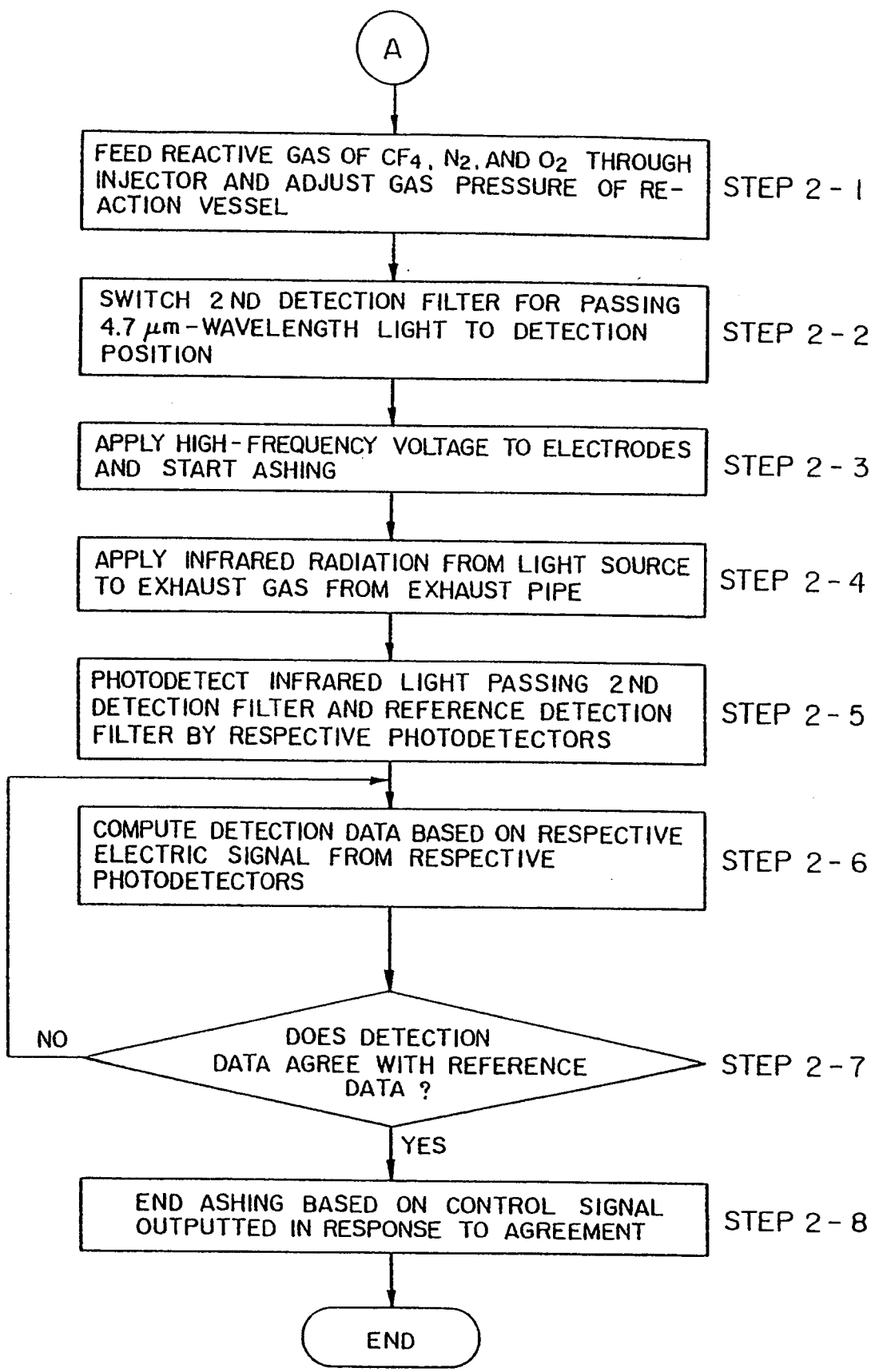
FIG. 7 is an operational flow chart of the method for controlling plasma surface-treatments of FIG. 6.
Figure 8:
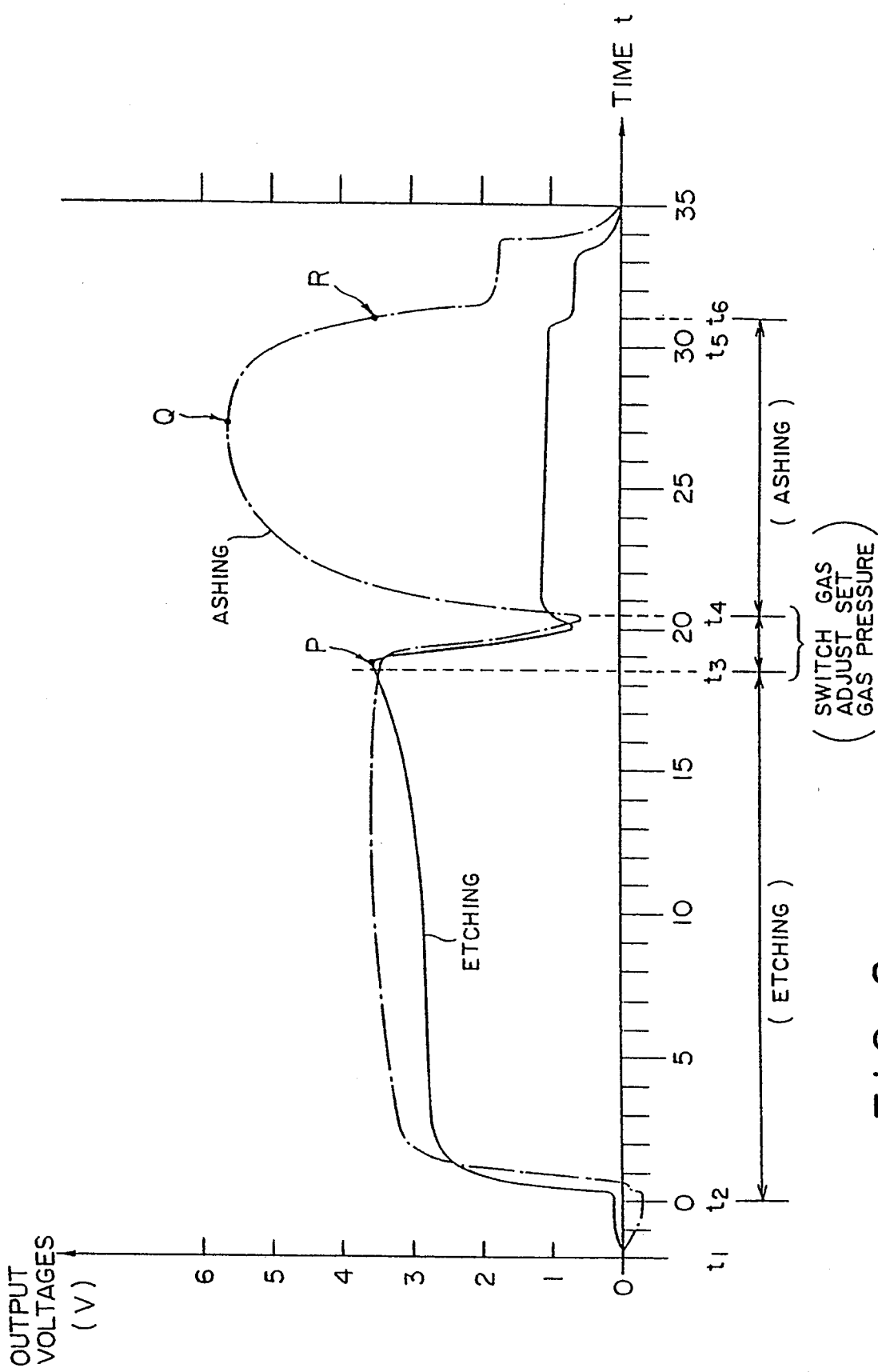
FIG. 8 is a timing chart of data of experiments on the plasma surface-treatments according to this invention.

FIG. 4 is a general block diagram of the controlling device used in this embodiment. FIG. 5 is a detailed structural view of the surface-treating device of FIG. 4. FIGS. 6 and 7 are operational flow charts of the controlling method according to this embodiment. FIG. 8 is a timing chart of datum of experiments made on the respective surface-treatments.

A controlling device to be used by the method for controlling plasma surface-treatments according to this embodiment comprises, as in FIG. 4, an optical system 3 disposed on the side of the discharge port of an exhaust passage 2 connected to a surface-treatment device 1 for applying infrared radiation to the exhaust gas from the discharge port, a photodetection unit 4 which is switched to detect light of infrared radiation from the light source 3 having wavelength ranges indicating characteristics of etching or ashing while detecting the infrared radiation of all wavelengths as references, and outputs electric signals corresponding to the respective detected light, and a control unit 5 which, based on the electric signals, produces and outputs control signals for detecting and controlling endpoints of the respective surface-treatments.

The optical system 3 comprises a light source 30 for emitting infrared radiation, and a collimator lens 31 for applying the infrared radiation in parallel rays to the photodetection unit 4 through the exhaust gas.

The photodetection unit 4 comprises a reference detection filter 41 for passing the infrared radiation of all wavelength ranges emitted from the optical system, a first detection filter 42 for passing a component of the infrared radiation having a 5.2 μm-wavelength range, and a second detection filter 43 for passing a component of the infrared radiation having a 4.7 μm-wavelength range, switching means 44 for switching the first and the second detection filters 42, 43 from each other in accordance with the etching and the ashing, a photodetector 46 for detecting the component of the set wavelength range (5.2 μm- or 4.7 μm-wavelength ranges) which has passed the first or the second filter 42, 43, and outputting detection electric signals, and a photodetector 45 for detecting all wavelength ranges of the light which has passed the reference detection filter 41, and outputting reference electric signals.

The controlling device 5 comprises a data computing unit 51 for computing detection data, based on detection electric signals and reference electric signals, a reference data memory 52 for storing reference data indicating endpoints of the etching and the ashing which have been given beforehand as experimental data, and a control/computation unit 53 for comparing the detection data with the reference data, and when both agree with each other, producing and outputting a control signal.

A main valve 21, a sample valve 22 and a vacuum dry pump 23 are installed, in the stated order away from the surface treatment device 1, in the exhaust passage 2 which is connected to the device 1 to be controlled. The optical system 3 using, e.g., infrared absorption, and the photodetection unit 4 are disposed on the side of the discharge of the vacuum pump 23 through a flexible tube 24 for monitoring gas concentrations of a produced gas, carbon monoxide, generated by, e.g., ashing.

Reaction gases are fed from an etching gas source 20C or an ashing gas source 20B into the surfacetreatment device 1 through the injector 20 by changing over the switching valves 20A, 20B from each other in accordance with the etching or the ashing. The switching is conducted through the controller 5B, based on the control signals from the control device 5. The gas discharge from the electrodes 16, 17 is conducted by applying a high-frequency RF which has been controlled by the controller 5B.

Then, a structure of the surface-treatment device 1 used in this invention will be explained with reference to FIG. 5. A reaction vessel 11 comprises an outer cylinder 11a of, e.g., quartz, and an inner cylinder 11b of, e.g., quartz conically received in the outer cylinder 11a with a gap between both cylinders.

A number of 2 mm-diameter holes 11c are vertically formed in the inner cylinder at each position corresponding a quarter of a circumference of the inner cylinder. An aluminium cover 12 disposed covering the outer circumference of the inner cylinder 11b and functions as an etching tunnel.

The outer cylinder 11a and the inner cylinder 11b are held at the lower ends thereof respectively by a cylindrical manifold 13 of, e.g., stainless steel. This manifold 13 is secured to a base plate. A disk-shaped cap 13a of, e.g., stainless steel is removably provided on the open lower end of the manifold 13. A rotary shaft 13b driven by a rotating mechanism 10 is inserted substantially in the center of the cap 13a air-tightly by, e.g., a magnetic seal. A turntable 13c is secured to the upper end of the rotary shaft 13b. A heat-insulating cylinder of quartz 13d is disposed on the upper surface of the turntable 13d. On the heat-insulating cylinder 13d there is mounted a wafer boat of quartz 14 which can accommodate 66 sheets, for example, of semiconductor wafers each substantially horizontally at a set vertical interval, e.g., 4.76 mm. The wafer boat 14 is loaded together with the cap 13a and the heat-insulating cylinder 13d into and out of the reaction vessel 5 by the conveyor mechanism 60.

An injector 20 is air-tightly inserted horizontal in a side of the manifold 13. The injector 20 has the inner end portion bent in an L-shape to be extended upright between the outer cylinder 11a and the aluminium cover 12. A number of gas outlet ports 15a are formed at a certain interval in the upper and the lower sides of the upright portion of the injector 20. The outer end of the injector 20 is connected to a gas supply source for plasma gases, such as fleon ($CF_4$) gas, oxygen gas ($O_2$), etc.

An exhaust pipe 2 is also connected to a side of the manifold 12 for discharging the treatment gas in the reaction vessel 11 to set the interior of the reaction vessel 11 at a low-pressure atmosphere.

A pair of electrodes 16, 17 of arcuate section enclose the outer circumference of the outer cylinder 11a with a certain gap therebetween. One of the electrodes 16 is connected to a high-frequency power source 6, and the other electrode 17 is grounded. Rod heaters 18, 19 are erected in the inner cylinder 11b.

The operation of the above-described device used in this embodiment will be explained in good detail with reference to FIGS. 4, 7 and 8 in connection with the method for operating the device.

First, a reaction gas comprising as the main components $CF_4$ and $O_2$ for the etching of Poly-Si or SiN is fed into the reaction vessel 11 through the injector 20 from the etching gas source 20C. The main valve 21 and the sub-valve 21 are adjusted, and the vacuum dry pump 23 is operated, so that the interior of the reaction vessel 11 is set at a gas pressure necessary for the etching (Step 1—1 of FIG. 6). In the detection unit 4, the switching means 44 switches the first detection filter 42 between the light source 30 and the photodetector 46 (Step 1—2). The first detection filter 42 may be provided by a band-pass filter, e.g., a buffer filter, for passing only a 5.2 μm-wavelength component of the infrared radiation from the light source 30, which (component) is characteristic of a produced gas generated in the reaction vessel 11 by the etching. Then, high-frequency RF is applied to the electrodes 16, 17 from the high-frequency electric power source 6 in FIG. 5, and the wafer boat 14 is rotated by the rotating mechanism 10. And the etching is started. When the etching is started, exhaust gas generated in the reaction vessel 11 is incessantly discharged outside by the vacuum dry pump 23 through the exhaust pipe 2. Infrared radiation is incessantly applied from the light source 30 to the discharged exhaust gas (Step 1-4). The applied infrared radiation passes the exhaust gas from the exhaust pipe 2. When the infrared radiation passes the exhaust gas, a component of the infrared radiation having a set wavelength is absorbed, by a set value, by the produced gas in the exhaust gas. The absorbed infrared radiation is filtered by the first detection filter 42 to admit the light of a 5.2 μm-wavelength. The reference detection filter 41 passes the infrared radiation of all wavelength ranges. The photodetector 46 detects the admitted light of a 5.2 μm-wavelength and outputs a detection electric signal, while the photodetector 45 detects the infrared radiation of all wavelength ranges and outputs a reference electric signal (Step 1-5).

The data computing until 51 computes delection data, based on the detection electric signal and the reference electric signal from the detection unit 4 (Step 1-6). The computed detection data may be values given by ratios of voltage values between the detection electric signal and the reference electric signal. The computed detection data is supplied to the control/computation unit 53. The control/computation unit 53 reads from a reference data memory 52 reference data indicative of an endpoint of the etching, and compares the detection data with the reference data to judge whether both data agree with each other (Step 1-7).

When the control/computation unit 53 judges both agree with each other, the unit 53 outputs a control signal for ending the etching. And the application of high-frequency voltage and the other operations involved in the etching are ended (Step 1-8). When the control/computation unit 53 judges that both do not agree with each other, the data computing unit 51 computes detection data, based on detection electric signals and reference electric signal successively detected and outputted respectively by the photodetectors 45, 46 (Step 1-6), and the control/computation unit 53 repeats the judgement until detection data agrees with reference data (Steps 1-7 and 1-8).

When the etching is over, the switching valves 20A is changed over to the switching valve 20B to feed a reaction gas comprising as the main component $CF_4$, $N_2$ and $O_2$ into the reaction vessel 11 through the injector 20, and a gas pressure in the reaction vessel 11 is adjusted by the operation of the vacuum dry pump 23, etc. (Step 2-1 in FIG. 7). In the detection unit 4 the switching means 44 switches the first detection filter 42 to the second detection filter 43 to pass a 4.7 μm-wavelength component of the infrared radiation from the light source 30 for the detection (Step 2—2). Such switching from the first detection filter 42 to the second detection filter 43 enables components of different wavelength ranges to be detected by one and the same photodetector 46 on the following stage.

Then, high-frequency RF is applied to the electrodes 16, 17, and ashing is started (Step 2-3). Infrared radiation is applied from the light source 30 to exhaust gas continuously discharged from the exhaust pipe 2 (Step 2-4). The applied infrared radiation passes the exhaust gas, and a component of the infrared radiation having a 4.7 μm-wavelength is absorbed by the gas produced in the ashing.

Then the component of the infrared radiation which has passed the exhaust gas is filtered by the second detection filter 43 and the reference detection filter 41, and then detected respectively by the photodetectors 45, 46 to be outputted to the control unit 5 respectively as a detection electric signal and a reference electric signal (Step 2-5). Based on the detection electric signal and the reference electric signal, the data computing unit 51 computes detection data (Step 2-6), and the control/computation unit 53 compares the detection data with reference data indicative of an endpoint of the ashing to judge whether both data agree with each other (Step 2-7). When the control/computation unit 53 judges both data agree with each other, the unit 53 outputs a control signal for ending the ashing (Step 2-8). In Step 2-7, the unit 53 judges both data disagree with each other, Steps 2-6 and 2-7 are repeated until detection data and reference data agree with each other.

The reference data for judging endpoints of etching and ashing can be given by experimental results. FIG. 8 shows a timing chart of the respective treatments according to the experimental results. In FIG. 8, output voltages V of the electric signals outputted from the detection unit 4 are taken on the vertical axis, and a treating time t (minutes) of the etching and the ashing are taken on the horizontal axis. The etching and the ashing are conducted as a continuous string of treatments.

In the etching, a reaction gas (raw gas) is fed into the reaction vessel 11 from a time $t_1$, and a gas pressure in the reaction vessel 11 is adjusted. At a time $t_2$ (0 minute) high-frequency RF is applied from the high-frequency electric power source 6 to the electrodes 16, 17, and the etching is started. When the etching is started, the detection unit 4 outputs electric signals of output voltages depicting the operational waveform of the solid line in FIG. 8.

The inflection point P near a time (19 minutes) on the operational waveform is used as a recognition reference for judging an endpoint based on the data. A time $t_3$ on the operational waveform before the inflection point P is stored in the reference data memory 52 in FIG. 4 as reference data for ending the etching.

Between a time $t_3$ and $t_4$ the gas discharge is stopped to feed a reaction gas for the ashing, and the interior of the reaction vessel is adjusted to a set gas pressure. After the adjustment, the gas discharge is resumed, and the ashing is started. The detection unit 4 outputs electric signals of output voltages depicting the waveform of the one-dot line in FIG. 8. As the recognition point for judging an endpoint of the ashing is used the point R on the operational waveform having about 70% of the output voltage value of the arcuate peak-value point Q on the operational waveform. A time $t_5$ is called here a just point for the etching.

The time $t_6$ (called the over point of the etching) corresponding to the point R on the operation waveform is stored as reference data for ending the etching in the reference data memory 52.

In the above-described embodiment, reference data are indicative of endpoints of the etching and the ashing, and based on the reference data endpoints of the etching and the ashing are detected for the control of plasma surface-treatments. But instead, data of the treating steps of either of the etching and the ashing are sampled or all continuously used, and based on the thus-prepared reference data, states of the respective treating steps are consecutively monitored for control.

In the above-described embodiment, etching and ashing are continuously conducted in one and the same surface-treatment device, but thin film formation, e.g., wafer processes including plasma CVD, etc. can be continuously conducted.

In the device used in the above-described embodiment, when an etching operation is shifted to an ashing operation, the first detection filter 42 is switched to the second detection filter 43. But instead, it is possible that light which has passed the exhaust gas is applied to the first and the second detection filters 42, 43, and the reference detection filter 41, and photodetectors 46 are provided corresponding to the respective filters 41, 42, 43. In this case, in the etching operation, the control unit 5 computes detection data, based on electric signals outputted from the photodetectors 46, 46 associated respectively with the first detection filter 42, and the reference detection filter 41, and in the ashing operation, the control unit 5 computes detection data, based on electric signals outputted from the photodetectors 46, 46 associated with the second detection filter and the reference detection filter 41. This case does not have to include the switching unit 44, which is necessary in the above-described embodiment.

In the above-described embodiment, the light from the light source 30 is infrared radiation, but the light source 30 may emit light of other difference wavelength ranges which can detect characteristics of produced gases generated in the respective surface-treatments.

As described above, in the method for controlling plasma surface-treatments according to this invention, in a plurality of kinds of surface-treatments, concentrations of produced gases contained in the exhaust gas are detected, and the detected concentration data and reference data are compared to continuously control and process the respective surface-treatments. As a result, advantageously processing control suitable for each kind of surface-treatment can be conducted, and one and the same surface-treatment device can continuously conduct different kinds of surface-treatments.

In this invention, light is applied to the exhaust gas from the reaction vessel accommodating objects to be treated; then that of the light which has passed the exhaust gas is passed through a plurality of detection filters to admit components of the light having set wavelengths corresponding to produced gases generated in respective surface-treatments, while a reference filter passes all wavelengths of the light applied to the exhaust gas; light which has passed the detection filters and the reference filter is detected by photodetectors associated with the respective filters to output electric signals; and the control unit compares detection data based on the electric signals with the preset reference data of the respective surface-treatments to control the respective surface treatments. As a result, light corresponding to states of the respective surface-treatment can be detected, and processes of respective surface-treatments can be conducted as a continuous string of processing by one and the same surface treatment device. Concentrations of produced gases in the exhaust gas are detected on the side of the exhaust pipe, which advantageously simplifies peripheral arrangements, for example, of the reactor.

One filter is switched to another filter in accordance with a surface-treatment, which simplifies the arrangement of the photodetectors on the following stage.

What is claimed is:

1. A method for controlling a plurality of kinds of plasma surface-treatments in which a plurality of kinds of surface-treatments are continuously conducted on objects to be treated in a reaction vessel with plasma discharges, said method comprising the steps of:

optically detecting, in a first one of the surface-treatments, a concentration of a produced gas generated in the first surface-treatment, which is contained in exhaust discharged from the reaction vessel;

comparing data of the detected concentration of the produced gas with preset reference data of the first surface-treatment to control the first surface-treatment;

optically detecting, in a second one of the surface-treatments, a concentration of a produced gas generated in the second surface-treatment, which is contained in exhaust discharged from the reaction vessel; and comparing data of the detected concentration of the produced gas with preset reference data of the second surface-treatment to control the second surface-treatment.

2. The method for controlling a plurality of kinds of plasma surface-treatments according to claim 1, wherein said preset reference data for the first and the second surface-treatments are endpoint data at endpoints of the first surface-treatment and of the second surface-treatment.

3. The method for controlling a plurality of kinds of plasma surface-treatments according to claim 1, wherein when the concentrations of the produced gases generated in the respective surface-treatments are optically detected, light is applied from a light source to exhaust gas discharged from an exhaust pipe connected to the reaction vessel.

4. The method for controlling a plurality of kinds of plasma surface-treatments according to claim 1, wherein when the concentrations of the produced gases generated in the respective surface-treatments are optically detected, said method further comprising the steps of:

passing only a set-wavelength component of light applied from a light source, which is absorbed by the produced gas in the exhaust gas generated in the first surface-treatment of said plurality of kinds of surface-treatments, by means of a first detection filter;

passing only a set-wavelength component of light applied from a light source, which is absorbed by the produced gas in the exhaust gas generated in the second surface-treatment of said plurality of kinds of surface-treatments, by means of a second detection filter;

passing all wavelengths of the light applied from the light source by means of a reference detection filter;

detecting the components which have passed the first and the second filters and the reference filter by their associated photodetectors, and outputting them in electric signals;

computing detection data based on the electric signals outputted from the respective photodetectors; and comparing the respective detection data with the respective preset reference data for the respective surface-treatments to control the respective surface-treatments.

5. The method for controlling a plurality of kinds of plasma surface-treatments according to claim 1, wherein when the respective surface-treatments are controlled, the preset reference data for the respective surface-treatments are endpoint data of the respective surface-treatments at endpoints, said method further comprising the steps of:

comparing the endpoint data and the detected concentration data by the control unit to control ends of the respective surface-treatments.

6. The method for controlling a plurality of kinds of plasma surface-treatments according to claim 1, wherein said first surface-treatment is etching.

7. The method for controlling a plurality of kinds of plasma surface-treatments according to claim 1, wherein said second surface-treatment is ashing.

8. The method for controlling a plurality of kinds of plasma surface-treatments according to claim 1, wherein said first and said second surface-treatments are batch processing.

9. The method for controlling a plurality of kinds of plasma surface-treatments according to claim 1, wherein said first and said second surface-treatments are conducted in a vacuum.

10. The method for controlling a plurality of kinds of plasma surface-treatments according to claim 1, wherein said first and said second surface-treatments are conducted in an atmosphere.

11. The method for controlling a plurality of kinds of plasma surface-treatments according to claim 1, wherein said objects to be treated are silicon wafers.

12. The method for controlling a plurality of kinds of plasma surface-treatments according to claim 1, wherein said objects to be treated are LCDs.

13. The method for controlling a plurality of kinds of plasma surface-treatments according to claim 1, wherein a mixed gas of fleon gas and oxygen gas is used in the plasma surface-treatments.

14. The method for controlling a plurality of kinds of plasma surface-treatments according to claim 1, wherein said light from the light source is infrared radiation.

15. The method for controlling a plurality of kinds of plasma surface-treatments according to claim 1, wherein said first detection filter and said second detection filter are switched from each other by a switching unit in accordance with a kind of the surface-treatments; and only the set-wavelength component associated with the surface-treatment of the kind, which is admitted through the operatively switched detection filter is detected by the associated photodetector.

* * * * *